United States Patent [19]

Tiwari

[11] Patent Number: 4,586,071
[45] Date of Patent: Apr. 29, 1986

[54] HETEROSTRUCTURE BIPOLAR TRANSISTOR

[75] Inventor: Sandip Tiwari, Ossining, N.Y.

[73] Assignee: International Business Machines Corporation, Armonk, N.Y.

[21] Appl. No.: 609,406

[22] Filed: May 11, 1984

[51] Int. Cl.⁴ .............................................. H01L 29/72
[52] U.S. Cl. ........................................ 357/34; 357/15; 357/16
[58] Field of Search ........................ 357/34, 16, 15, 65, 357/68, 35, 86

[56] References Cited

U.S. PATENT DOCUMENTS

| 3,780,359 | 12/1973 | Dumke et al. | 317/235 R |
| 3,938,243 | 2/1976 | Rosvold | 29/578 |
| 3,943,554 | 3/1976 | Russell et al. | 357/34 |
| 4,005,469 | 1/1977 | Chang | 357/15 |
| 4,379,005 | 4/1983 | Hovel et al. | 148/187 |
| 4,443,808 | 4/1984 | Kihara | 357/15 |

FOREIGN PATENT DOCUMENTS 54-6777 1/1979 Japan .

OTHER PUBLICATIONS

IBM TDB, vol. 17, No. 6, Nov. 1974, pp. 1814–1816, "Contact Barriers to Semiconductor Crystals", by M. H. Brodsky.
IEEE International Solid State Circuits Conference, Session XIV, Schottky Transistor Logic, Berger and Weidmann.
IBM TDB, vol. 14, No. 4, Sep. 1971, pp. 1248–1249, "GaAs Field-Effect Transistors with Self-Registered Gates", by Dumke et al.

Primary Examiner—Andrew J. James
Assistant Examiner—Mark Prenty
Attorney, Agent, or Firm—Alvin J. Riddles

[57] ABSTRACT

A heterojunction bipolar transistor having an ohmic contact at the intersection of the base and an adjacent region serving as emitter or collector that forms an ohmic contact to the base and a Schottky barrier to the adjacent emitter or collector. A GaAs-GaAlAs device with a platinum or palladium electrode over the intersection between collector and base and forming an ohmic contact to a p-base region and a Schottky barrier with an n-collector region thereof.

4 Claims, 3 Drawing Figures

HETEROSTRUCTURE BIPOLAR TRANSISTOR

DESCRIPTION

1. Technical Field

The technical field of the invention is that of heterostructure bipolar transistors.

Transistors made of more than one type of semiconductor material are known as heterostructure transistors. Such materials are usually the intermetallic type such as gallium arsenide and gallium aluminum arsenide. These materials have some advantageous properties and some properties that require special consideration in use. In bipolar transistor structures, the size of the extrinsic base region may cause the base resistance to be higher than desirable and efforts to compensate usually involve positioning the base contact very close to either the collector electrode or the emitter electrode. Heterostructure transistors are also susceptible to saturation and steps must be taken to either prevent or control it.

2. Background Art

Efforts to position base and collector electrodes in closer proximity have been employed in the art using indirect processing such as by deposition and etching from an angle so that the dimension on the horizontal is smaller. Saturation has been controlled in silicon devices using a metal that bridges two regions and the composition under the metal provides a different impedance. This saturation control technique is shown in U.S. Pat. No. 3,938,243.

DISCLOSURE OF THE INVENTION

The invention is the use of a specific type metal electrode over the intersection of the collector or emitter and the base region of a bipolar heterojunction transistor which when in place operates to serve the combined functions of a base electrode closely spaced to a junction and a Schottky barrier saturation control clamp between the base and either the emitter or collector electrodes of the transistor.

The electrode of applicant's invention permits the closest spacing between base contact and an adjacent region which is usually the collector and at the same time and with the same structural element a clamp is provided which prevents saturation.

The invention achieves these advantages by providing a metal electrode that forms an ohmic contact with the base region and a Schottky barrier contact with the adjacent, usually the collector region. While the metal electrode of the invention may serve as a saturation clamp on the emitter, the more prevalent use and description used in this specification is for a collector saturation clamp. The electrode can be positioned on the intersection between base and collector resulting in the minimum base to collector spacing yet electrical shorting does not take place due to the metal electrode to collector Schottky barrier impedance. When in operation, the electrode also serves as a clamp for the transistor. As the saturation condition is approached, the base region of these devices would reach a potential with respect to either the emitter or collector that is opposite to the normal potential but such situation is prevented because the Schottky barrier portion of the electrode of the invention at that point becomes forward biased.

While the invention will be described in connection with the intermetallic semiconductor materials GaAs and alloys thereof, it will be apparent to one skilled in the art in the light of the principles disclosed that a number of semiconductor materials, such as GaInAlAs, AlInAs, GaInAl and InP, and related metals may be used without departing from the spirit of the invention.

In order to set the advantages of the invention off more clearly, description will first be provided of the base to collector spacing problem in the prior art.

Figure 1:
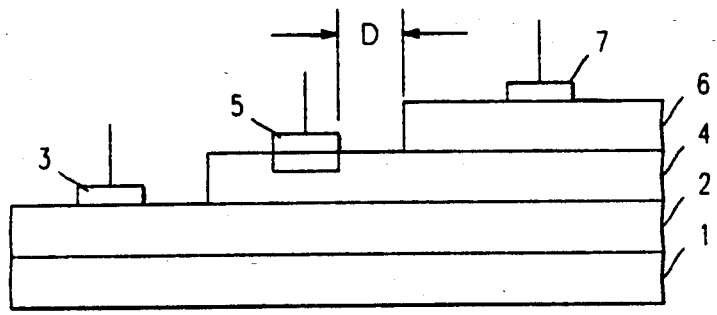
FIG. 1 is an illustration of a prior art bipolar heterojunction transistor illustrating a critical base electrode collector spacing.

Referring to FIG. 1, there is an illustration of a heterostructure bipolar transistor of the type available in the prior art. Such a transistor typically has a substrate 1 of for example gallium arsenide. In epitaxial relationship therewith there is an n emitter region 2 of for example GaAlAs. An ohmic emitter electrode 3 is provided to the emitter region 2. In epitaxial relationship with the emitter region 2 is a base region 4 of for example p-type GaAs or p-type graded GaAlAs. An ohmic base electrode contact 5 is provided to the base region 4. In epitaxial relationship with base region 4 is a collector region 6 of n-conductivity different semiconductor material forming a heterojunction. The collector region may be of GaAlAs or GaAs. An ohmic collector electrode contact 7 is provided to the region 6.

It will be apparent to one skilled in the art that the vertical distances and some horizontal distances will be somewhat exaggerated in order to illustrate the principles of the invention.

In the structure of FIG. 1 a high extrinsic base to collector resistance is encountered. The resistance can be reduced by reducing the dimension shown in FIG. 1 as D. The smaller the dimension D, the less resistance would be encountered. There is, however, a practical limit in most construction processes such as photolithography in that a distance much smaller than a micron in today's technology is not achievable. The situation is aggravated when in higher response devices, the vertical dimension of the region 4 is made very thin which in turn reduces the cross section and the resistance increases further. In structures such as this, the resistance can be partly reduced by heavily doping the p-region 4 to produce a lower resistivity but when this is done, undesirable capacitance results and the performance of the device deteriorates.

Figure 2:
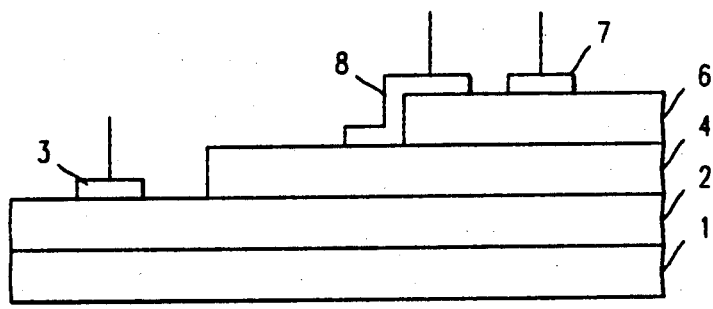
FIG. 2 is an illustration of the structure of the invention.

Referring next to FIG. 2, in accordance with the invention, a selected metal electrode is placed over the intersection of the base region and the collector region. The metal electrode forms an ohmic contact with the base region and forms a Schottky barrier contact with the collector region. The metal electrode further serves as the combination of a closely spaced base contact coupled with a built-in collector-to-base Schottky barrier clamp.

In FIG. 2, using essentially the same reference numerals as FIG. 1 for like items, an n+ substrate is epitaxially joined to an n emitter 2 with an ohmic emitter contact 3 provided. An epitaxial region 4 and a collector 6 forming a hetero-collector junction are provided. An ohmic collector contact 7 is also provided. The transistors may operate with a common emitter and hence may not have the contact 3.

The point of departure for the invention is the contact 8 positioned across the intersection between the base 4 and the collector 6 which forms both an ohmic contact with the base region 4 and a Schottky barrier contact with the collector region 6. Since the ohmic contact with the base region 4 is at the point of intersection between the collector region 6 and the base region 4 it is at the minimum spacing and because of the Schottky barrier impedance with the collector 6 no processing accommodation need be made to prevent shorting.

The well known Schottky clamp is thus simultaneously provided that prevents carrier build-up in the base during saturation.

Figure 3:
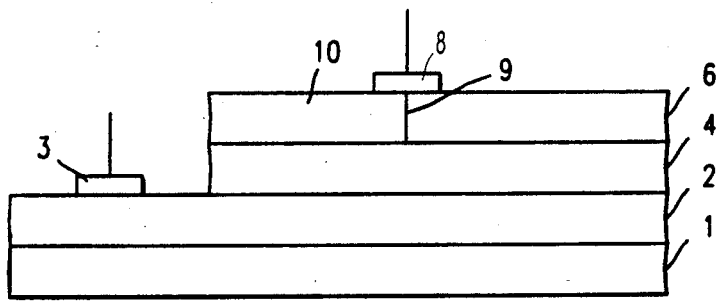
FIG. 3 is an illustration of an alternate structure of the invention.

Referring to FIG. 3, an alternate structure of the invention is illustrated where a portion of the collector region 6 is converted such as by ion implantation to the same conductivity type as the base 4 and the electrode member 8 positioned across the intersection 9 forms an ohmic contact with the converted region 10 and a Schottky barrier rectifying contact with the region 6. While the conversion is shown for illustration as ending at an interface between layers, in practice it may penetrate as far as desired. All other reference numerals are as employed in the structures of the other Figures.

BEST MODE FOR CARRYING OUT THE INVENTION

The preferred method of carrying out the invention involves providing for the region 1 an n+ GaAs substrate doped to approximately $10^{18}$ atoms per cm$^3$. The n-GaAlAs emitter would be doped with silicon to about $10^{17}$ atoms per cm$^3$. The p-base 4 would be doped with beryllium or magnesium to about $10^{18}$ atoms per cm$^3$ providing a $10^{-2}$ ohm-cm base resistance. The n collector 6 of GaAs would be doped to about $10^{17}$ with silicon.

The base collector contact 8 of the invention would be made of palladium, platinum or nickel and their silicides sintered at an approximate temperature of about 500° C. The electrodes 3 and 7 would be standard ohmic connections in the art such as AuGe.

It will be apparent to one skilled in the art that the electrode 8 of the invention is a simple solution that achieves a structure that solves two well known in the art problems.

What has been described is an electrode that serves as a combined base to collector or base to emitter contact forming an ohmic contact to the base at the intersection where the collector or emitter region joins the base and extends over the collector or emitter region forming a Schottky barrier contact thereto so that both a minimum base to collector or emitter to base spaced ohmic base contact is provided together with a Schottky collector or emitter clamp for a heterostructure bipolar transistor.

Having thus described my invention, what I claim as new and desire to secure by Letters Patent is:

1. In a heterojunction bipolar transistor, the improvement comprising:
   a metal electrode positioned in contact with the base region and at least one of the collector and emitter regions, said electrode being of a metal selected with respect to the base region and the adjacent collector or emitter region such that an ohmic contact is provided to the base and a Schottky barrier contact is provided to the adjacent region.

2. The transistor of claim 1 wherein said base is at least one of GaAs or GaAlAs and said adjacent region is the other of at least one of GaAs or GaAlAs, and said metal is taken from the group of platinum, palladium or nickel and their silicides.

3. A heterostructure bipolar transistor of the type having the base and an adjacent region serving as emitter or collector regions thereof exposed at a surface, the improvement for base resistance and clamping performance comprising:
   a metal member forming an ohmic contact to said base and a Schottky barrier contact to said adjacent region, positioned across the interface between said base and said adjacent region.

4. The structure of claim 3 wherein said base is one of GaAs or GaAlAs and said collector is the other of GaAs or GaAlAs, and said metal is taken from the group of platinum, palladium or nickel and their silicides.

* * * * *